(12) United States Patent
Byrd

(10) Patent No.: US 11,867,734 B2
(45) Date of Patent: Jan. 9, 2024

(54) ELECTRICAL TESTING METER AND METHOD OF USING THE SAME

(71) Applicant: Honeywell International Inc., Morris Plains, NJ (US)

(72) Inventor: Reginald Alan Byrd, Summerville, SC (US)

(73) Assignee: Honeywell International Inc., Morris Plains, NJ (US)

( * ) Notice: Subject to any disclaimer, the term of this patent is extended or adjusted under 35 U.S.C. 154(b) by 654 days.

(21) Appl. No.: 16/569,756

(22) Filed: Sep. 13, 2019

(65) Prior Publication Data

US 2021/0080494 A1 Mar. 18, 2021

(51) Int. Cl.
*G01R 25/00* (2006.01)
*G05B 15/02* (2006.01)
*H04W 4/80* (2018.01)

(52) U.S. Cl.
CPC ............. *G01R 25/00* (2013.01); *G05B 15/02* (2013.01); *H04W 4/80* (2018.02)

(58) Field of Classification Search
None
See application file for complete search history.

(56) References Cited

U.S. PATENT DOCUMENTS

| | | | |
|---|---|---|---|
| 9,086,436 B2* | 7/2015 | Nagpal | G01R 15/06 |
| 2013/0069627 A1* | 3/2013 | CS | G01R 19/2513 |
| | | | 324/76.77 |
| 2018/0095123 A1* | 4/2018 | Biswas | H02J 13/00002 |

OTHER PUBLICATIONS

Salisbury Safety Line, PD800W Cordless Phasing Tester User Guide, [online], [retrieved Feb. 20, 2020], URL: http://userequip.com/files/specs/5215/PD800W%20Cordless%20phasing%20tester.pdf, 16 pages.

* cited by examiner

*Primary Examiner* — Douglas X Rodriguez
(74) *Attorney, Agent, or Firm* — Alston & Bird LLP

(57) ABSTRACT

Various embodiments are directed to apparatuses and methods for testing an electrical circuit related to an electrical circuit. The electrical testing meter may generate electrical measurement data based at least in part on electrical signals received via at least one electrical measurement terminal in contact with one or more references points of the electrical circuit. Electrical circuit characteristic data may be generated based at least in part on the electrical measurement data. The electrical measurement data and/or the electrical circuit characteristic data may be transmitted to one or more remote computing entities to generate a consolidated record of electrical measurement data for the electrical circuit, which may be rendered for display at the one or more remote computing entities. The transmitted data may be stored for future reproduction and/or analysis.

20 Claims, 7 Drawing Sheets

ELECTRICAL TESTING METER AND METHOD OF USING THE SAME

BACKGROUND

Sensors and devices may be utilized to characterize various aspects of an electrical circuit in a wide variety of applications. As just one example, a voltmeter may be utilized for monitoring circuit conditions, such as monitoring and/or characterizing the phase voltage difference between two distinct reference points on an electrical power line. These voltmeters are generally only useful for the operator of the voltmeter, as the voltmeters are configured to receive electric signals and display output electrical data on a local screen or gauge corresponding to the electrical circuit. Other individuals working near the voltmeter operator must then rely on the operator to call-out information displayed on the local screen or gauge if relevant to the other individuals.

Accordingly, a need exists for an improved electrical testing meter characterized by remote operation and connectivity, user-friendly data consolidation and presentation, and increased data transmission functionality.

BRIEF SUMMARY

Various embodiments relate to an electrical testing meter configured to generate electrical measurement data related to an electrical circuit and transmit the electrical measurement data to one or more remote computing entities.

Various embodiments are directed to an electrical testing meter comprising a housing, at least one electrical measurement terminal configured to engage an electrical circuit at one or more reference points and to generate electrical measurement data related to the electrical circuit, a controller, and a wireless transmitter configured to transmit the electrical measurement data to one or more computing entities. In various embodiments, the controller may be configured to generate one or more electrical circuit characteristic data based at least in part on the electrical measurement data. In various embodiments, the one or more electrical circuit characteristic data may comprise one or more phase voltage difference data and one or more phase angle measurement data. In various embodiments, the electrical testing meter may be a phasing voltmeter. In various embodiments, the at least one electrical measurement terminal may be configured to measure a first electrical measurement data at a first reference point and a second electrical measurement data at a second reference point. In various embodiments, the controller may be configured to determine one or more of a phase voltage difference data and a phase angle measurement data between the first electrical measurement data and the second electrical measurement data. In various embodiments, the wireless transmitter may be configured to transmit the electrical measurement data to one or more remote computing entities using a first communication network. In various embodiments, the first communication network is a Bluetooth network. In various embodiments, the one or more remote computing entities may comprise at least one or more of a management computing entity and a client computing entity configured to receive the one or more electrical measurement data via one or more communication networks. In various embodiments, the one or more remote computing entities may comprise a client computing entity configured to receive and transmit one or more electrical measurement data via one or more communication networks. In various embodiments, the controller may be configured to render at least a portion of the electrical measurement data for display in an electrical measurement data interface.

Various embodiments relate to a method for testing an electrical circuit. Various embodiments are directed to a method for testing an electrical circuit comprising generating electrical measurement data related to an electrical circuit based at least in part on electrical signals received via at least one electrical measurement terminal in contact with one or more references points of the electrical circuit; and transmitting the electrical measurement data to one or more remote computing entities to generate a consolidated record of electrical measurement data for the electrical circuit at the one or more remote computing entities. In various embodiments, the method may further comprise storing the electrical measurement data in an electrical measurement data repository. In various embodiments, the method may further comprise generating one or more electrical circuit characteristic data based at least in part on the electrical measurement data. In various embodiments, the electrical measurement data may be generated using a phasing voltmeter. In various embodiments, generating electrical measurement data may comprise measuring a first electrical measurement data at a first reference point and a second electrical measurement data at a second reference point. In various embodiments, the method may further comprise rendering at least a portion of the electrical measurement data for display in an electrical measurement data interface. In various embodiments, the electrical measurement data may be transmitted to the one or more remote computing entities using a first communication network. In various embodiments, the first communication network may be a Bluetooth network. In various embodiments, the one or more remote computing entities may comprise at least one or more of a management computing entity and a client computing entity configured to receive one or more electrical measurement data via one or more communication networks. In various embodiments, the one or more remote computing entities may comprise a client computing entity configured to receive and transmit one or more electrical measurement data via one or more communication networks.

BRIEF DESCRIPTION OF THE DRAWINGS

Reference will now be made to the accompanying drawings, which are not necessarily drawn to scale, and wherein.

DETAILED DESCRIPTION

Figure 1:
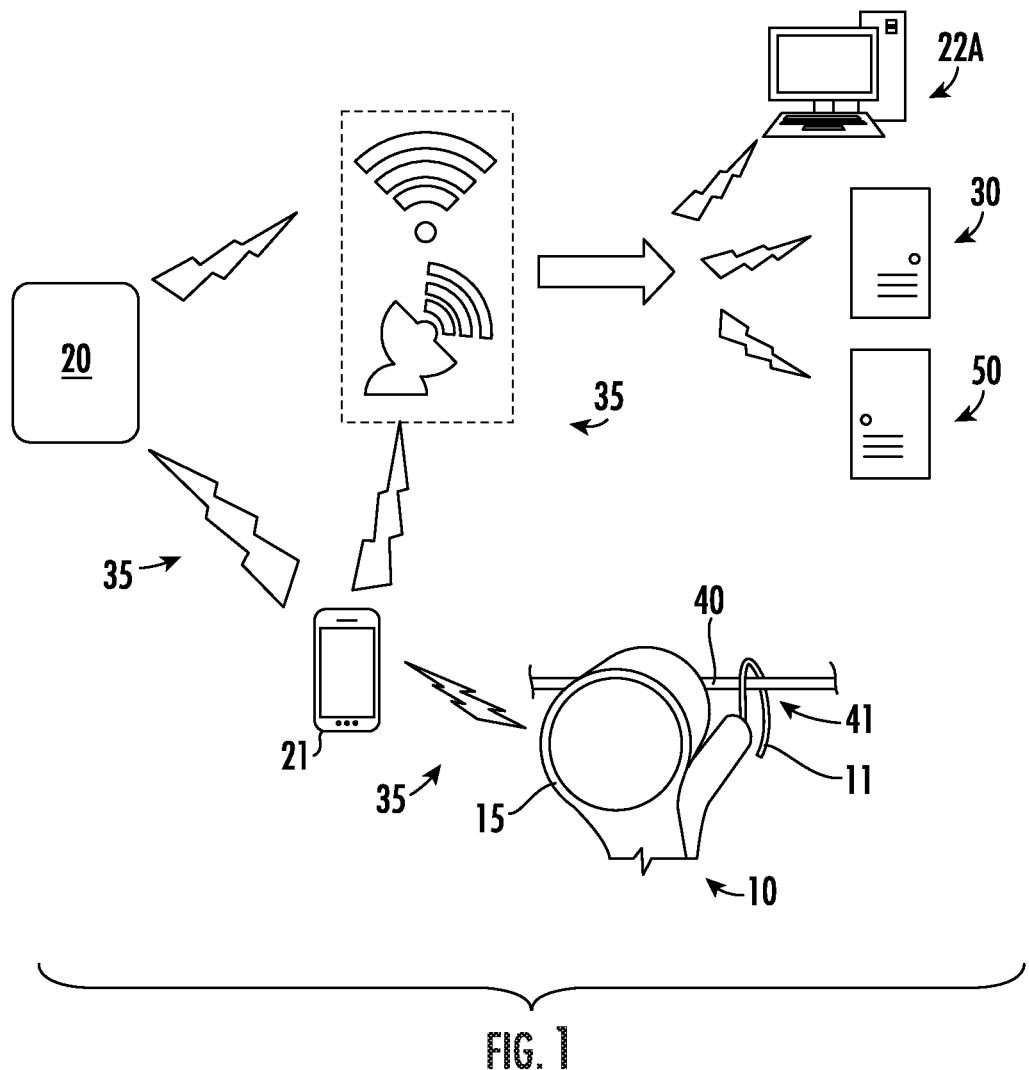
FIG. 1 schematically illustrates an exemplary network communication architecture in accordance with various embodiments.

The present disclosure more fully describes various embodiments with reference to the accompanying drawings.

It should be understood that some, but not all embodiments are shown and described herein. Indeed, the embodiments may take many different forms, and accordingly this disclosure should not be construed as limited to the embodiments set forth herein. Rather, these embodiments are provided so that this disclosure will satisfy applicable legal requirements. Like numbers refer to like elements throughout.

It should be understood at the outset that although illustrative implementations of one or more aspects are described below, the disclosed assemblies, systems, and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents. While values for dimensions of various elements are disclosed, the drawings may not be to scale.

The words "example," or "exemplary," when used herein, are intended to mean "serving as an example, instance, or illustration." Any implementation described herein as an "example" or "exemplary embodiment" is not necessarily preferred or advantageous over other implementations.

Overview

Described herein is an electrical testing meter configured to generate electrical measurement data related to an electrical circuit and transmit the electrical measurement data to one or more remote computing entities. The electrical testing meter discussed herein may be configured to generate electrical measurement data related to an electrical circuit (e.g., an electrical power line or an electrical panel bus). The electrical testing meter may be further configured to generate electrical circuit characteristic data based at least in part on the electrical measurement data, which may be used to determine whether various elements of an electrical circuit may be safely electrically connected. In various embodiments, the electrical testing meter described herein is further configured to transmit at least a portion of the electrical measurement data and/or electrical circuit characteristic data to one or more remote computing entities (e.g., line worker cellular device, signal transceiver, corporate management computing entity).

The connectivity and/or data transmission functionality of the present invention enables the generation of a consolidated record of electrical measurement data related to an electrical circuit and facilitates the analysis of the electrical measurement data in real-time. For example, the electrical measurement data may not only be generated at the electrical testing meter for a line worker to utilize locally, but may also be transmitted to a client device of the line worker proximate the electrical testing meter. Further the data may also be transmitted to a remote corporate management server or a remote line worker device for display and real-time analysis by engineers or by other line workers, respectively, working on the same power line, and spaced some distance (e.g., several miles) away. The electrical measurement data may be displayed in a consolidated report on an electrical measurement data interface, accessible, for example, in an app on the remote device. Further, the electrical measurement data and/or the electrical circuit characteristic data may be transmitted to a management computing entity for storage and/or data analytics functionalities.

As designed, the electrical testing meter described herein promotes safety and enables increased preventative maintenance functionalities by enabling real-time dissemination of electrical measurement data and/or electrical circuit characteristic data throughout a network of remote devices.

Apparatus

The electrical testing meter 10 may comprise a housing 15, at least one electrical measurement terminal, a controller, and a wireless transmitter. In various embodiments, the housing 15 may enclose various components of the electrical testing meter, such as, for example, at least a portion of at least one electrical measurement terminal, a controller, and/or a wireless transmitter. In various embodiments, the electrical testing meter may further comprise a user interface configured to display one or more of electrical measurement data and electrical circuit characteristic data related to an electrical circuit. In various embodiments, the electrical testing meter 10 may be an electrical testing meter used for testing high-voltage power lines. For example, the electrical testing meter 10 may be a type of voltmeter, such as, for example, a voltage detector or a phasing voltmeter.

As illustrated in FIG. 1, an electrical testing meter 10 may comprise at least one electrical measurement terminal 11 configured to engage an electrical circuit 40 at one or more reference points 41 and to generate electrical measurement data related to the electrical circuit 40. In various embodiments, the electrical measurement data related to the circuit may comprise, for example, voltage measurement data, or any measurable data related to the electrical circuit. In various embodiments, voltage measurement data may comprise, for example, a voltage value measured by the electrical measurement terminal at a reference point. In various embodiments, the one or more reference points 41 may comprise one or more locations within the electrical circuit 40, such as, for example, along a ground line, along a neutral line, along a live line defining a phase test point and/or at a capacitive test point. In various embodiments, the electrical circuit 40 may comprise an electrical power cable or an electrical panel and may further comprise at least one energized conductor.

In various embodiments, the electrical testing meter 10 may further comprise a controller 13 configured to receive the electrical measurement data generated by the at least one electrical measurement terminal. In various embodiments, the controller 13 may be further configured to determine one or more electrical circuit characteristic data based at least in part on the electrical measurement data. The electrical circuit characteristic data may comprise the electrical measurement data. In various embodiments, the one or more electrical circuit characteristic data may comprise one or more phase voltage difference data and/or one or more phase angle measurement data determined between various reference points. In various embodiments, phase voltage difference data may comprise a difference between a first a voltage value measured at a first reference point and a second voltage value measured at a second reference point. In various embodiments, phase angle measurement data may comprise, for example, a phase angle value measured between a first reference point and a second reference point. In various embodiments, the first reference point and may be located on a first live line defining a first phase, and the second reference point may be located on a second live line defining a second phase. The one or more phases (e.g., the first phase and the second phase) may each be associated with a respective capacitor (e.g., a first capacitor and a second capacitor) within the electrical circuit 40. In various embodiments, the phase voltage difference data, analyzed between the first phase and the second phase at the first reference point and the second reference point, respectively, may comprise a phase voltage difference value of at least substantially zero. Further, in various embodiments, the phase angle measurement data, analyzed between the first phase and the second phase at the first reference point and the second reference point, respectively, may comprise a phase angle value of at least substantially zero. In such circumstances, it should be understood that the first conductor, associated with the first phase, and the second conductor, associated with the second phase, are of the same phase, and therefore may be safely connected. In various embodiments, the controller 13 may be configured to determine when two conductors are of the same phase, and in response generate a safe circuit indicator associated with the electrical measurement data. In such circumstances, the electrical circuit characteristic data may comprise the safe circuit indicator generated by the controller 13. In various embodiments, the electrical circuit characteristic data may further comprise location data associated with one or more reference points 41 and/or one or more respective capacitors. In such circumstances, the controller 13 may be configured to associate the location data with the electrical measurement data generated at a particular reference point 41 such that one or more determined electrical circuit characteristic data may be associated with a particular location within an electrical circuit 40. In various embodiments, the location data may comprise GPS data generated by one or more of the electrical testing meter 10, a client computing entity 21, and a signal transceiver 20.

In various embodiments, an electrical testing meter 10 may further comprise a wireless transmitter 14 configured to transmit the electrical measurement data generated by the at least one electrical measurement terminal to one or more remote computing entities using one or more communication networks 35, as described herein. In various embodiments, the one or more remote computing entities may comprise one or more of a client computing entity, a plurality of client computing entities, a signal transceiver, and a managing computing entity. The one or more remote computing entities may be configured to receive the electrical measurement data transmitted from the wireless transmitter of the electrical testing meter 10. In various embodiments, the one or more remote computing entities may be further configured to receive electrical circuit characteristic data transmitted from the wireless transmitter of the electrical testing meter 10. In various embodiments, the one or more remote computing entities may be further configured to generate a consolidated record of electrical measurement data for the electrical circuit.

As illustrated in FIG. 1, the wireless transmitter of the electrical testing meter 10 may be configured to transmit electrical circuit characteristic data comprising electrical measurement data related to the electrical circuit 40 to a client computing entity 21 through a first communication network. As described herein, the first communication network may be, for example, a Bluetooth network, wherein the electrical testing meter 10 may communicate with the client computing entity 21 via a Bluetooth wireless transmission protocol. The client computing entity 21 may be configured to receive the electrical circuit characteristic data comprising electrical measurement data. In various embodiments, the client computing entity 21 may be configured to display at least a portion of the electrical circuit characteristic data received from the electrical testing meter 10. In various embodiments, the client computing entity 21 may be further configured to transmit the electrical circuit characteristic data comprising electrical measurement data to one or more of a signal transceiver 20, one or more client computing entities of a plurality of client computing entities 22 (e.g., 22A, 22B, 22N), a management computing entity 30, and a remote electrical measurement data repository 50 via one or more communication networks 35, as described herein. For example, as illustrated in FIG. 1, the client computing entity 21 may be configured to transmit the electrical circuit characteristic data comprising electrical measurement data to a management computing entity 30 using a cellular network. For example, as illustrated in FIG. 1, the client computing entity 21 may transmit the electrical circuit characteristic data comprising electrical measurement data to a signal transceiver 20 via a second communication network. As described herein, the communication second network may be, for example, a Bluetooth network, wherein the client computing entity 21 may communicate with signal transceiver 20 via a Bluetooth wireless transmission protocol. The signal transceiver 20 may be configured to receive the electrical circuit characteristic data comprising electrical measurement data. In various embodiments, the signal transceiver 20 may be further configured to transmit the electrical circuit characteristic data comprising electrical measurement data to one or more of one or more client computing entities of a plurality of client computing entities 22 (e.g., 22A, 22B, 22N), a management computing entity 30, and a remote electrical measurement data repository 50 via one or more communication networks, as described herein. For example, as illustrated in FIG. 1, the signal transceiver 20 may be configured to transmit the electrical circuit characteristic data comprising electrical measurement data to the client computing entity (e.g., 22A) using a local area network connection such as, for example, a Wi-Fi network.

Each of the one or more client computing entities of a plurality of client computing entities 22 (e.g., 22A, 22B, 22N), the management computing entity 30, and the remote electrical measurement data repository 50 may be configured to receive the electrical circuit characteristic data comprising electrical measurement data from the electrical testing meter 10, the client computing entity 21, and/or the signal transceiver 20 via the one or more communication networks 35, as described herein. In various embodiments, each of the client computing entities of the plurality of client computing entities 22 may be configured to display at least a portion of the received electrical circuit characteristic data. In various embodiments, each of the client computing entities of the plurality of client computing entities 22 may be configured to display at least a portion of the received electrical circuit characteristic data. In various embodiments, the management computing entity 30 may be configured to display at least a portion of the received electrical circuit characteristic data. In various embodiments, the at least a portion of the received electrical circuit characteristic data may be displayed in an electrical measurement data interface. Further, the management computing entity 30 may be configured to store at least a portion of the received electrical circuit characteristic data. The remote electrical measurement data repository 50 may be configured to store at least a portion of the received electrical circuit characteristic data. In various embodiments, the management computing entity 30 may interact with the remote electrical measurement data repository 50. The management computing entity 30 may be configured to transmit and/or receive the electrical circuit characteristic data comprising electrical measurement data to and/or from the remote electrical measurement data repository 50 via a communication network, as described herein. The remote electrical measurement data repository 50 may comprise one or more of a cloud data storage system and/or a locally maintained data storage system. In various embodiments, the remote electrical measurement data repository 50 may further be operable to carry out various data analytics executable instructions upon receiving the electrical measurement data and/or the electrical circuit characteristic data.

Figure 2:
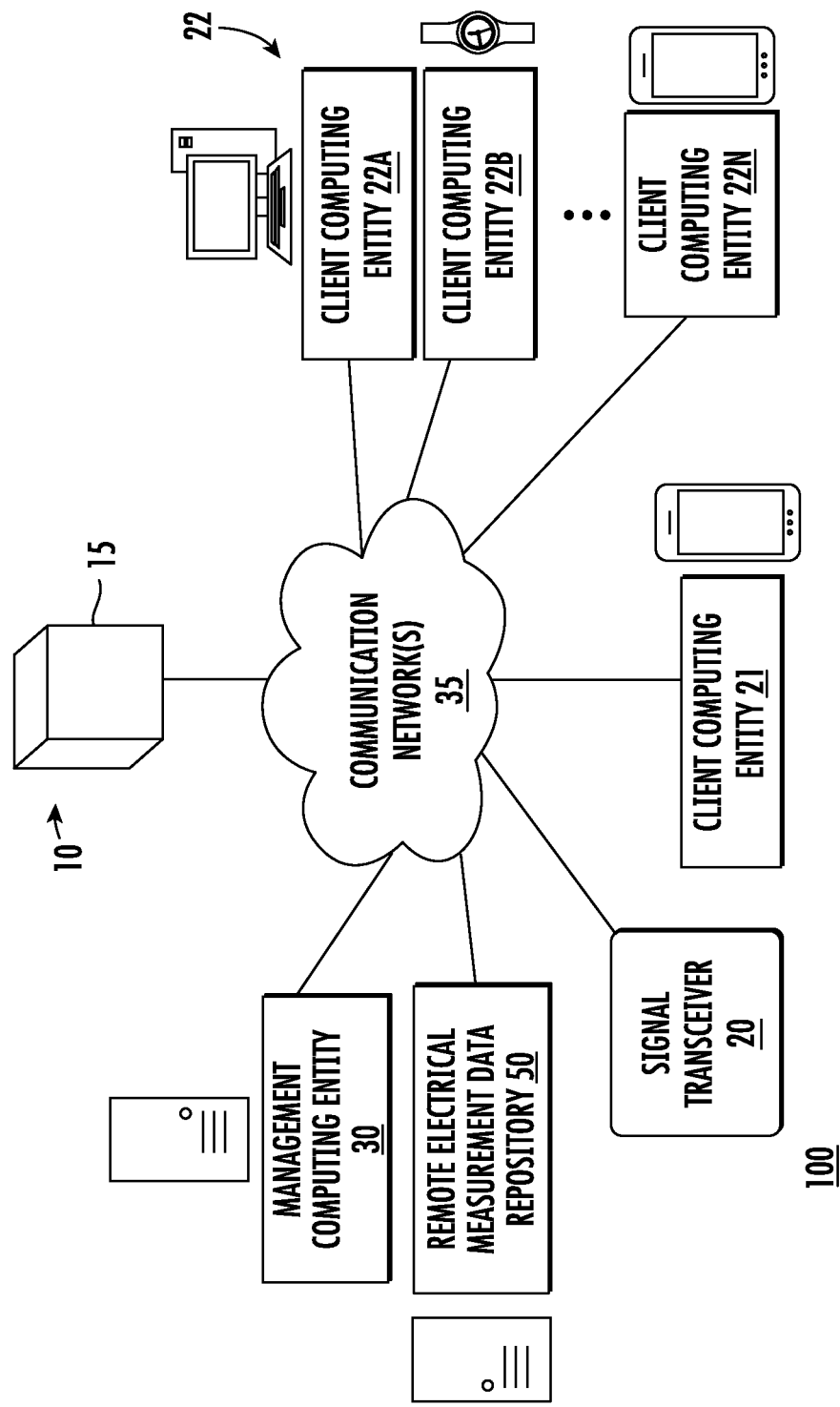
FIG. 2 illustrates data flows among components in accordance with some embodiments discussed herein.

FIG. 2 provides an illustration of an electronic measurement data communication system 100 that can be used in conjunction with various embodiments of the present invention. As shown in FIG. 2, the electronic measurement data communication system 100 may comprise an electrical testing meter 10, a client computing entity 21, one or more management computing entities 30, one or more client computing entities 22, one or more signal transceivers 20, one or more remote electrical measurement data repositories 50, one or more communication networks 35, and/or the like. Each of the components of the system may be in electronic communication with, for example, one another over the same or different wireless or wired networks 35 including, for example, a wired or wireless Personal Area Network (PAN), Local Area Network (LAN), Metropolitan Area Network (MAN), Wide Area Network (WAN), and/or the like. For example, in various embodiments, the one or more communication networks 35 described herein may use any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra wideband (UWB), infrared (IR) protocols, near field communication (NFC) protocols, Wibree, Bluetooth protocols, wireless universal serial bus (USB) protocols, and/or any other wireless protocol. Additionally, while FIG. 2 illustrates certain system entities as separate, standalone entities, the various embodiments are not limited to this particular architecture.

Figure 3:
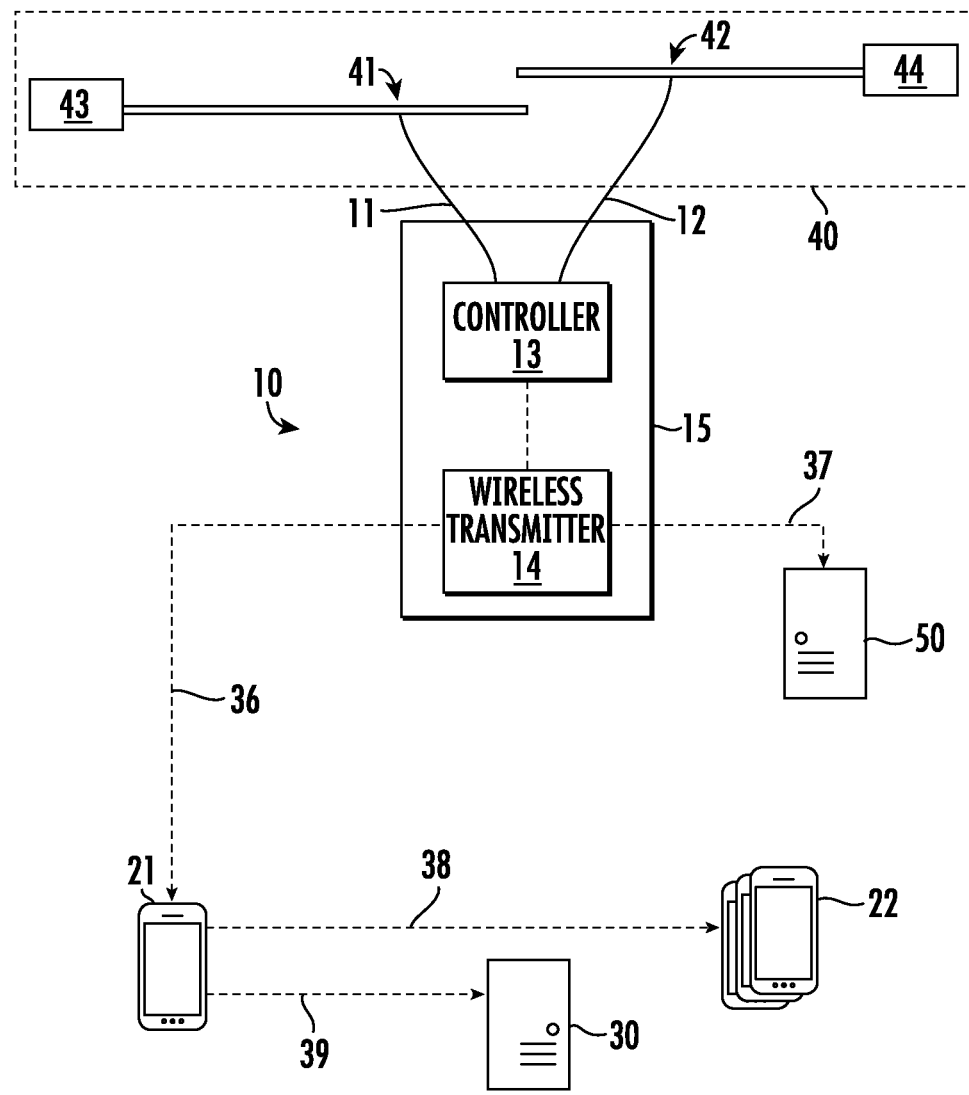
FIG. 3 schematically illustrates an exemplary apparatus in accordance with various embodiments.

In various embodiments, the electrical testing meter 10 may comprise at least one electrical measurement terminal comprising a conductive material configured to engage an electrical circuit at one or more reference points and to generate electrical measurement data related to the electrical circuit. As illustrated in FIG. 3, the electrical testing meter 10 may comprise a first electrical measurement terminal 11 configured to engage an electrical circuit 40 at a first reference point 41, and a second electrical measurement terminal 12 configured to engage the electrical circuit 40 at a second reference point 42. In various embodiments, the first reference point 41 may be at a location within the electrical circuit 40 such that the first electrical measurement terminal 11 may be configured to generate electrical measurement data related to a first conductor 43. Further, in various embodiments, the second reference point 42 may be at a location within the electrical circuit 40 such that the second electrical measurement terminal 12 may be configured to generate electrical measurement data related to a second conductor 44. In various embodiments, the first conductor 43 may be associated with a first phase, and the second conductor 4 may be associated with a second phase.

The first electrical measurement terminal 11 and the second electrical measurement terminal 12 may each be electronically connected to the controller 13. In various embodiments, the controller 13 may be configured to generate one or more electrical circuit characteristic data related to one or both of the first conductor 43 and the second conductor 44 based at least in part on the electrical measurement data generated at the first reference point 41 and the second reference point 42. In various embodiments, the controller 13 may be configured to determine whether the first conductor 43, associated with the first phase, and the second conductor 44, associated with the second phase, are of the same phase, and thus, whether the conductors 43, 44 may be safely connected, as described herein. For example, the controller may be configured to generate phase voltage difference data by determining a difference between a first a voltage value measured at a first reference point 41 and a second voltage value measured at a second reference point 42. In various embodiments in which the controller 13 determines that the first conductor 43 and the second conductor 44 may be safely connected, the controller 13 may be configured to generate a safe circuit indicator associated with the electrical measurement data. In such circumstances, the electrical circuit characteristic data may comprise the safe circuit indicator generated by the controller 13, as well as one or more of the phase voltage difference data and the phase angle measurement data.

The wireless transmitter 14 may be configured to transmit electrical circuit characteristic data comprising electrical measurement data related to the electrical circuit 40 to one or more remote computing entities via a communication network 35. In various embodiments, the wireless transmitter 14 may be further configured to transmit electrical circuit characteristic data comprising electrical measurement data related to a remote electronic measurement data repository 50 via a second communication network 37. As described herein, the second communication network 37 may be, as non-limiting examples, one of a Wi-Fi network or a cellular network. As illustrated in FIG. 3, the one or more remote computing entities may comprise a client computing entity 21, which may be configured to receive electrical circuit characteristic data through a first communication network 36. As described herein, the first communication network 36 may be, for example, a Bluetooth network, wherein the electrical testing meter 10 may communicate with the client computing entity 21 via a Bluetooth wireless transmission protocol. In various embodiments, the client computing entity 21 may be configured to transmit the electrical circuit characteristic data comprising electrical measurement data to a plurality of client computing entities 22 through a third communication network 38. In various embodiments, the client computing entity 21 may be further configured to transmit the electrical circuit characteristic data comprising electrical measurement data to a management computing entity 30 through a fourth communication network 39. As described herein, the third communication network 38 and the fourth communication network 39 may each be, as non-limiting examples, one of a Wi-Fi network or a cellular network. In various embodiments, one or more of the remote computing entities may be configured to display at least a portion of the electrical measurement data and/or electrical circuit characteristics via an electrical measurement data interface.

Figure 4:
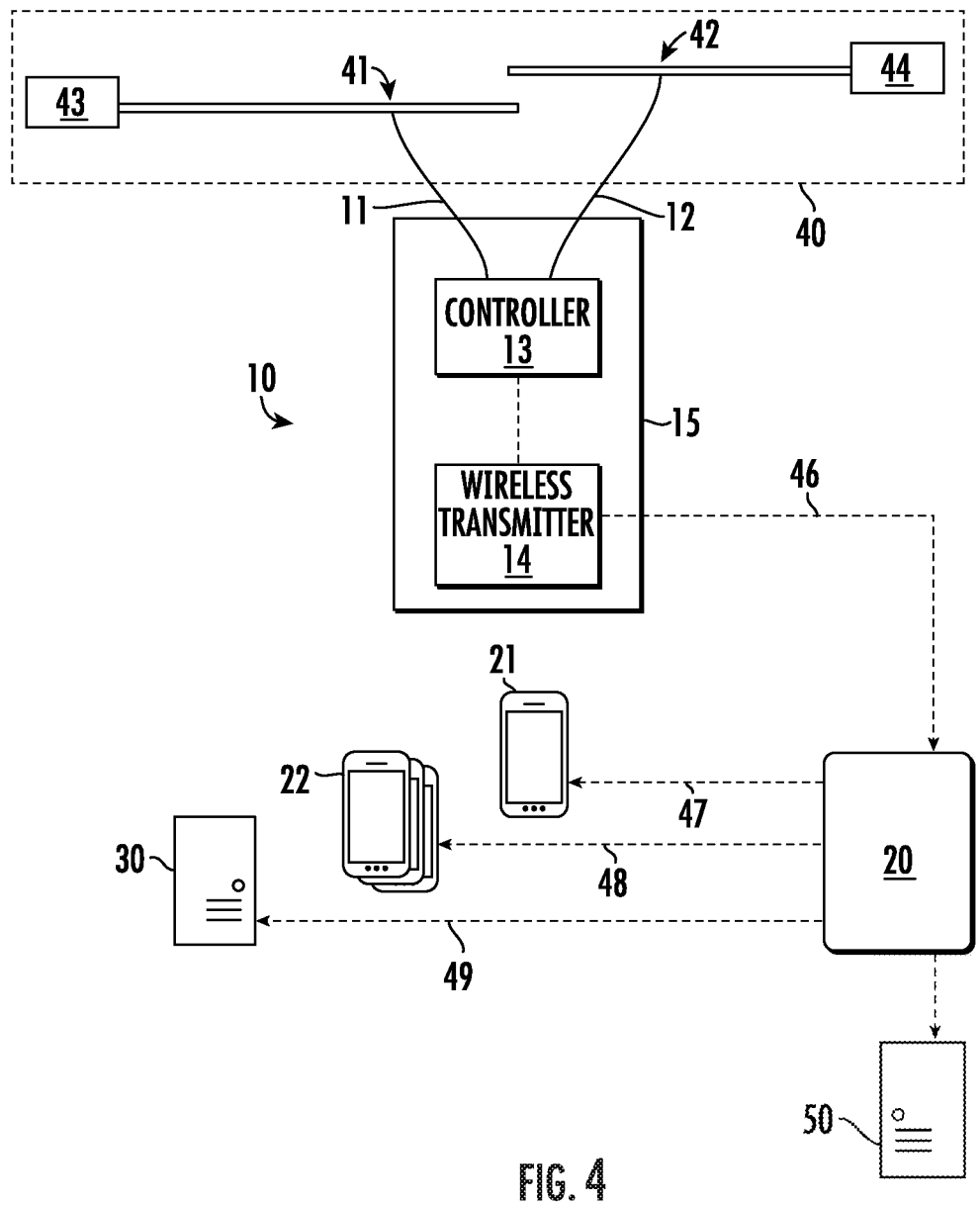
FIG. 4 schematically illustrates an exemplary apparatus in accordance with various embodiments.

As illustrated in FIG. 4, the one or more remote computing entities may comprise a signal transceiver 20, which may be configured to receive electrical circuit characteristic data through a first communication network 46. In various embodiments, the signal transceiver 20 may be further configured to transmit the electrical circuit characteristic data comprising electrical measurement data to a client computing entity 21, a plurality of client computing entities 22, and a management computing entity 30 through a second communication network 47, third communication network 48, and fourth communication network 49, respectively. the signal transceiver 20 may be further configured to transmit the electrical circuit characteristic data comprising electrical measurement data to a remote electrical measurement data repository 50. As shown in FIGS. 3 and 4, the remote electrical measurement data repository 50 may be configured to receive data from one or more of the electrical testing meter 10, the client computing entity 21, or any other remote computing entity configured to transmit electrical circuit characteristic data.

Figure 5:
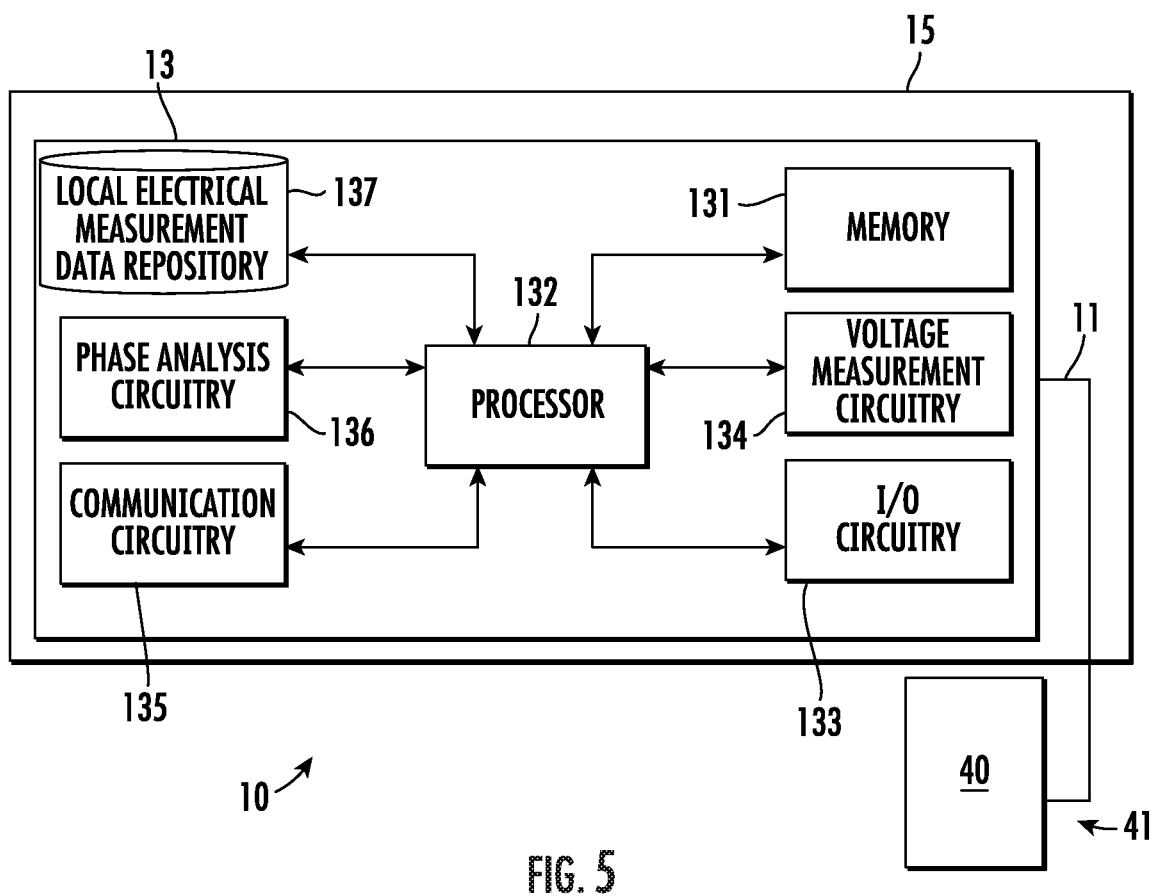
FIG. 5 shows a schematic diagram of an exemplary apparatus according to one embodiment.

As shown in FIGS. 3-5, the electrical testing meter 10 may comprise a controller 13. FIG. 5 provides a schematic of an electrical testing meter 10 and controller 13 according to one embodiment of the present invention.

As illustrated in FIG. 5, the controller 13 may comprise a memory 131, a processor 132, input/output circuitry 133, communication circuitry 135, a local electrical measurement data repository 137, voltage measurement circuitry 134, and phase analysis circuitry 136. The controller 13 may be configured to execute the operations described herein. Although the components are described with respect to functional limitations, it should be understood that the particular implementations include the use of particular hardware. It should also be understood that certain of the components described herein may include similar or common hardware. For example, two sets of circuitry may both leverage use of the same processor, network interface, storage medium, or the like to perform their associated functions, such that duplicate hardware is not required for each set of circuitry. The use of the term "circuitry" as used herein with respect to components of the controller 13 should therefore be understood to include particular hardware, hardware and, in some embodiments, software for configuring the hardware configured to perform the functions associated with the particular circuitry as described herein. The term "circuitry" should be understood broadly to include hardware and, in some embodiments, software for configuring the hardware. For example, in some embodiments, "circuitry" may include processing circuitry, storage media, network interfaces, input/output devices, and the like. In some embodiments, other elements of the controller 13 may provide or supplement the functionality of particular circuitry. For example, the processor 132 may provide processing functionality, the memory 131 may provide storage functionality, the communications circuitry 135 may provide network interface functionality, and the like.

In some embodiments, the processor 132 (and/or co-processor or any other processing circuitry assisting or otherwise associated with the processor) may be in communication with the memory 131 via a bus for passing information among components of the apparatus. The memory 131 may be non-transitory and may include, for example, one or more volatile and/or non-volatile memories. For example, the memory 131 may be an electronic storage device (e.g., a computer readable storage medium). In various embodiments, the memory 131 may be configured to store information, data, content, applications, instructions, or the like, for enabling the apparatus to carry out various functions in accordance with example embodiments of the present disclosure. It will be understood that the memory 131 may be configured to store partially or wholly any electronic information, data, computer program products described herein, or any combination thereof. As a non-limiting example, the memory 131 may be configured to store electrical measurement data, electrical circuit characteristic data, phase voltage difference data, phase angle measurement data, capacitance data, timestamp data, and location data associated with an electrical circuit 40 and/or one or more components thereof.

The processor 132 may be embodied in a number of different ways and may, for example, include one or more processing devices configured to perform independently. Additionally or alternatively, the processor may include one or more processors configured in tandem via a bus to enable independent execution of instructions, pipelining, and/or multithreading. The use of the term "processing circuitry" may be understood to include a single core processor, a multi-core processor, multiple processors internal to the apparatus, and/or remote or "cloud" processors.

In an example embodiment, the processor 132 may be configured to execute instructions stored in the memory 131 or otherwise accessible to the processor. Alternatively, or additionally, the processor may be configured to execute hard-coded functionality. As such, whether configured by hardware or software methods, or by a combination thereof, the processor may represent an entity (e.g., physically embodied in circuitry) capable of performing operations according to an embodiment of the present disclosure while configured accordingly. Alternatively, as another example, when the processor is embodied as an executor of software instructions, the instructions may specifically configure the processor to perform the algorithms and/or operations described herein when the instructions are executed.

In some embodiments, the controller 13 may include input-output circuitry 133 that may, in turn, be in communication with the processor 132 to provide output to the user and, in some embodiments, to receive input such as a command provided by the user. The input-output circuitry 133 may comprise a user interface, such as a graphical user interface (GUI), and may include a display that may include a web user interface, a GUI application, a mobile application, a client device, or any other suitable hardware or software. In some embodiments, the input-output circuitry 133 may also include a display device, a display screen, user input elements, such as a touch screen, touch areas, soft keys, a keyboard, a mouse, a microphone, a speaker (e.g., a buzzer), a light emitting device (e.g., a red light emitting diode (LED), a green LED, a blue LED, a white LED, an infrared (IR) LED, an ultraviolet (UV) LED, or a combination thereof), or other input-output mechanisms. The processor 132, input-output circuitry 133 (which may utilize the processing circuitry), or both may be configured to control one or more functions of one or more user interface elements through computer-executable program code instructions (e.g., software, firmware) stored in a non-transitory computer-readable storage medium (e.g., memory 131). Input-output circuitry 133 is optional and, in some embodiments, the controller 13 may not include input-output circuitry. For example, where the controller 13 does not interact directly with the user, the controller 13 may generate user interface data for display by one or more other devices with which one or more users directly interact and transmit the generated user interface data to one or more of those devices. For example, the controller 13, using user interface circuitry may generate user interface data for display by one or more display devices and transmit the generated user interface data to those display devices. In various embodiments, the input-output circuitry 133 may generate an electrical measurement data interface configured to display at least a portion of the electrical measurement data and/or electrical circuit characteristic data.

The communications circuitry 135 may be a device or circuitry embodied in either hardware or a combination of hardware and software that is configured to receive and/or transmit data from/to a network and/or any other device, circuitry, or module in communication with the controller 13. In various embodiments, the communications circuitry 135 may comprise the wireless transceiver 14. For example, the communications circuitry 135 may be configured to communicate with one or more computing entities via wired (e.g., USB) or wireless (e.g., Bluetooth, Wi-Fi, cellular, and/or the like) communication protocols.

In various embodiments, the processor 132 may be configured to communicate with the voltage measurement circuitry 134. The voltage measurement circuitry 134 may be a device or circuitry embodied in either hardware or a combination of hardware and software that is configured to generate electrical measurement data related to an electrical circuit based at least in part on electrical signals received via at least one electrical measurement terminal 11 in contact with one or more references points 41 of the electrical circuit 40. In various embodiments, the voltage measurement circuitry 134 may be configured to generate one or more voltage measurement data identifiers to one or more respective electrical measurement data, such that the one or more electrical measurement data may be identified and or referenced. In various embodiments, the voltage measurement circuitry 134 may be configured to render at least a portion of the electrical measurement data for display in an electrical measurement data interface. Further, in various embodiments, the voltage measurement circuitry 134 may be configured to transmit electrical measurement data to one or more components of the controller 13, such as, for example, the local electrical measurement data repository 137 and/or the phase analysis circuitry. In various embodiments, the voltage measurement circuitry 134 may be further configured to associate location data with the electrical measurement data generated at a particular reference point 41 such that one or more determined electrical circuit characteristic data may be associated with a particular location within an electrical circuit 40.

In various embodiments, the processor 132 may be configured to communicate with the phase analysis circuitry 136. The phase analysis circuitry 136 may be a device or circuitry embodied in either hardware or a combination of hardware and software that is configured to receive electrical measurement data from the voltage measurement circuitry 134. In various embodiments, the phase analysis circuitry 136 may be configured to generate one or more electrical circuit characteristic data based at least in part on the electrical measurement data, as described herein. For example, the phase analysis circuitry 136 may be configured to determine phase voltage difference data related to various conductors within an electrical circuit 40 based at least in part on two or more voltage values. For further example, the phase analysis circuitry 136 may be configured to determine phase angle measurement data related to various phases within an electrical circuit 40. Further, in various embodiments, the phase analysis circuitry 136 may be configured to render at least a portion of the electrical circuit characteristic data for display in an electrical measurement data interface. In various embodiments, the voltage measurement circuitry 134 may be further configured to associate location data with the electrical circuit characteristic data. In various embodiments, the phase analysis circuitry 136 may be configured to determine when two or more conductors are of the same phase, and in response generate a safe circuit indicator associated with the electrical measurement data.

In various embodiments, the electrical testing meter 10 may be configured with, or in communication with, a local electrical measurement data repository 107. The local electrical measurement data repository 107 may be stored, at least partially on the memory 201 of the electrical testing meter 10. In some embodiments, the local electrical measurement data repository 107 may be remote from, but in connection with, the electrical testing meter 10. The local electrical measurement data repository 107 may contain information, such as, for example, various electrical measurement data, electrical circuit characteristic data, phase voltage difference data, phase angle measurement data, and location data associated with an electrical circuit 40 and/or one or more components thereof.

Figure 6:
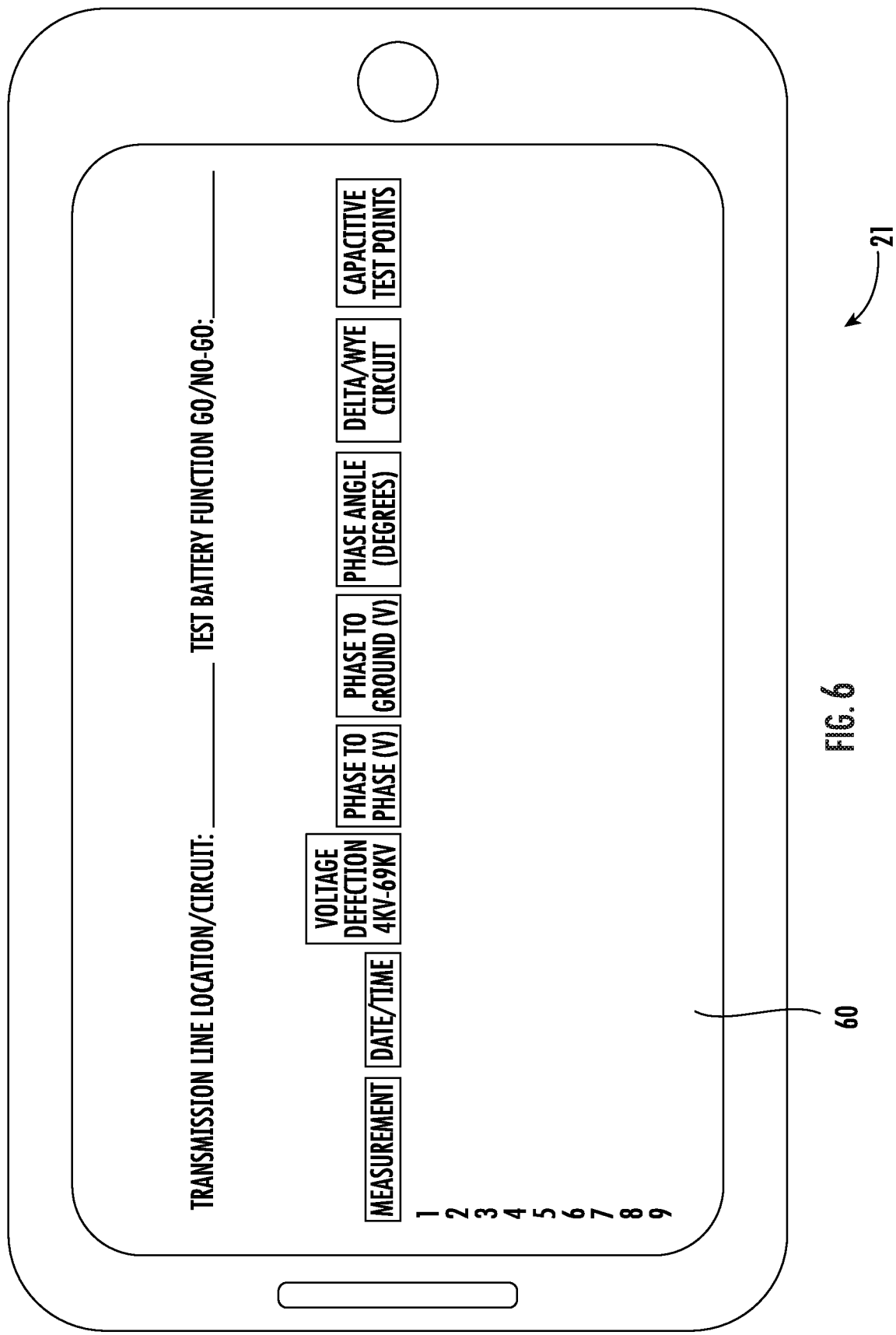
FIG. 6 illustrates an example usage of a client computing entity according to an embodiment.

FIG. 6 illustrates an exemplary client computing entity 21 configured to display an electrical measurement data interface 60 according to an exemplary embodiment described herein. In various embodiments, a remote computing entity may be configured to receive at least a portion of electrical measurement data and/or electrical circuit characteristic data, which may be rendered for display within an electrical measurement data interface 60. In various embodiments, the electrical measurement data interface 60 may be configured to display a consolidated record of electrical measurement data and/or electrical circuit characteristics. As shown in FIG. 6, an electrical measurement data interface 60 may be configured to display at least a portion of electrical measurement data and/or electrical circuit characteristic data, such as, for example, location data, an electrical measurement data identifier, timestamp data, a voltage value, one or more phase voltage difference data, one or more phase angle measurement data, capacitance data, and a safe circuit indicator. In certain embodiments, various functionality provided by a client computing entity 21 may be provided through a software development kit (SDK), through which the functionality discussed herein may be incorporated into a multi-function app executable via a client computing entity 21.

Embodiments of the present invention may be implemented in various ways, including as computer program products that comprise articles of manufacture. Such computer program products may include one or more software components including, for example, software objects, methods, data structures, and/or the like. A software component may be coded in any of a variety of programming languages including low level programming languages and/or high level programming languages.

A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, computer program products, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM), enterprise flash drive, magnetic tape, or any other non-transitory magnetic medium, compact disc read only memory (CD-ROM), compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory (VRAM), cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present invention may also be implemented as methods, apparatus, systems, computing devices, computing entities, and/or the like. Embodiments of the present invention may also take the form of an entirely hardware embodiment, an entirely computer program product embodiment, and/or an embodiment that comprises a combination of computer program products and hardware performing certain steps or operations.

Embodiments of the present invention are described below with reference to block diagrams and flowchart illustrations. Thus, it should be understood that each block of the block diagrams and flowchart illustrations may be implemented in the form of a computer program product, an entirely hardware embodiment, a combination of hardware and computer program products, and/or apparatus, systems, computing devices, computing entities, and/or the like carrying out instructions, operations, steps, and similar words used interchangeably (e.g., the executable instructions, instructions for execution, program code, and/or the like) on a computer-readable storage medium for execution.

Method

Figure 7:
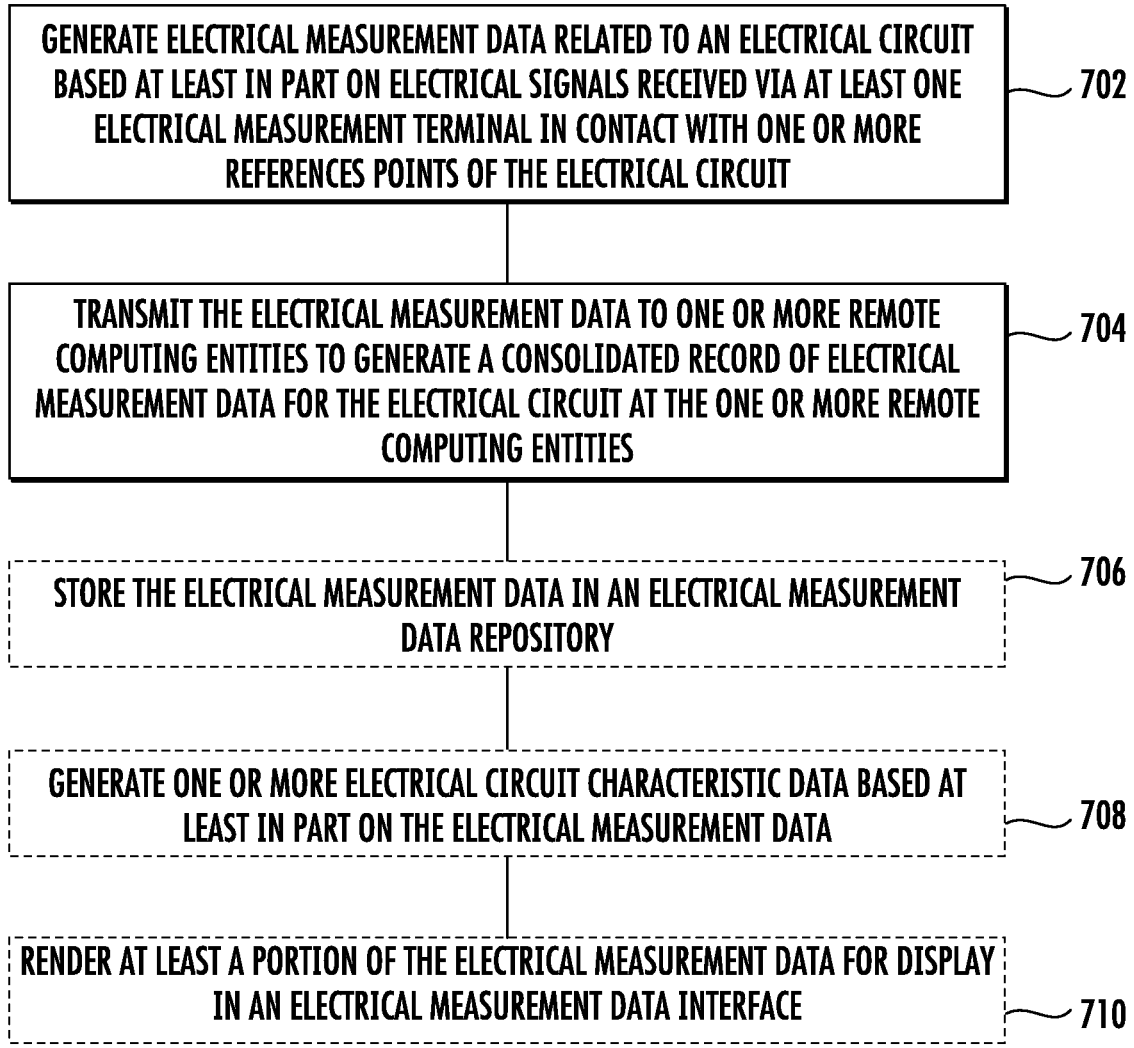
FIG. 7 illustrates a flow diagram of an exemplary method for testing an electrical circuit according to embodiments of the present disclosure.

FIG. 7 illustrates a block diagram of an exemplary method 700 for testing an electrical circuit in accordance with some embodiments discussed herein.

At block 702, electrical measurement data related to an electrical circuit may be generated based at least in part on electrical signals received via at least on electrical measurement terminal in contact with one or more reference points of the electrical circuit. In various embodiments, the electrical measurement data may be generated using an electrical testing meter, as discussed herein. In various embodiments, for example, the electrical testing meter may be a phasing voltmeter. In various embodiments, generating electrical measurement data comprises measuring a first electrical measurement data at a first reference point and a second electrical measurement data at a second reference point.

After the electrical measurement data related to an electrical circuit is generated, at block 704, the electrical measurement data may be transmitted to one or more remote computing entities for display and/or to generate a consolidated record of electrical measurement data for the electrical circuit. In various embodiments, the electrical measurement data may be transmitted to the one or more remote computing entities using a first communication network. The first communication network may be, for example, a wireless Personal Area Network (PAN), Local Area Network (LAN), Wide Area Network (WAN), and/or the like, as described herein. In various embodiments, the first communication may be a Bluetooth network. In various embodiments, the one or more remote computing entities may comprise at least one or more of a management computing entity and a client computing entity configured to receive one or more electrical measurement data via one or more communication networks. In various embodiments, the one or more remote computing entities may comprise a client computing entity configured to receive and transmit one or more electrical measurement data via one or more network connections. In various embodiments, the electrical measurement data and/or electrical circuit characteristic data may be transmitted from a first remote computing entity to a second remote computing entity and/or a plurality of remote computing entities via one or more communication networks.

In various embodiments, as shown at block 706, the electrical measurement data may be stored in an electrical measurement data repository. The electrical measurement data repository may be embodied as a data storage device such as a Network Attached Storage (NAS) device or devices, or as a separate database server or servers. The electrical measurement data repository may comprise one or more of a local electrical measurement data repository 137 and a remote electrical measurement data repository 50. In various embodiments, a local electrical measurement data repository 137 and a remote electrical measurement data repository 50 may be configured to be in communication with one another. The electrical measurement data repository may include information accessed and stored by one or more of an electrical testing meter 10 and/or a remote computing entity to facilitate various operations and functionalities as described herein. For example, the electrical measurement data repository may include, without limitation, a plurality of electrical measurement data and/or electrical circuit characteristic data, and/or the like.

In various embodiments, as shown at block 708, one or more electrical circuit characteristic data may be generated based at least in part on the electrical measurement data. As described herein, in various embodiments, the electrical circuit characteristic data may comprise, for example, electrical measurement data, phase voltage difference data, phase angle measurement data, capacitance data, timestamp data, location data, one or more electrical measurement data identifiers, and one or more safe circuit identifiers associated with an electrical circuit 40. The one or more electrical circuit characteristic data may be generated by an electrical testing meter, as described herein.

In various embodiments, as shown at block 710, at least a portion of the electrical measurement data may be rendered for display in an electrical measurement data interface. In various embodiments, a remote computing entity may be configured to receive at least a portion of electrical measurement data and/or electrical circuit characteristic data, which may be rendered for display within an electrical measurement data interface. In various embodiments, the electrical measurement data interface may display a consolidated record of electrical measurement data and/or electrical circuit characteristics. An electrical measurement data interface 60 may display at least a portion of electrical measurement data and/or electrical circuit characteristic data, such as, for example, location data, an electrical measurement data identifier, timestamp data, a voltage value, one or more phase voltage difference data, one or more phase angle measurement data, capacitance data, and a safe circuit indicator. In certain embodiments, various functionality provided by a remote computing entity may be provided through a software development kit (SDK), through which the functionality discussed herein may be incorporated into a multi-function app executable via a remote computing entity.

CONCLUSION

Many modifications and other embodiments will come to mind to one skilled in the art to which this disclosure pertains having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation That which is claimed:
1. An electrical testing meter, the electrical testing meter comprising:
   a housing;
   at least one electrical measurement terminal configured to engage an electrical circuit at one or more reference points and to generate electrical measurement data related to the electrical circuit at a first location;
   a controller configured to generate a safe circuit indicator based on at least one of phase voltage difference data and phase angle measurement data that is identified using the electrical measurement data measured at the first location, wherein the safe circuit indicator indicates that a plurality of conductors are in same phase in the electrical circuit; and
   a wireless transmitter configured to transmit at least a portion of the electrical measurement data and the safe circuit indicator to at least one client device associated with an operator upon determining that the operator is working on the electrical circuit at a second location different from the first location.

2. The electrical testing meter of claim 1, wherein the controller is configured to generate one or more electrical circuit characteristic data based at least in part on the electrical measurement data.

3. The electrical testing meter of claim 2, wherein the one or more electrical circuit characteristic data comprise one or more phase voltage difference data and one or more phase angle measurement data.

4. The electrical testing meter of claim 1, wherein the electrical testing meter is a phasing voltmeter.

5. The electrical testing meter of claim 1, wherein the at least one electrical measurement terminal is configured to measure a first electrical measurement data at a first reference point and a second electrical measurement data at a second reference point, and wherein the controller is configured to determine one or more of a phase voltage difference data and a phase angle measurement data between the first electrical measurement data and the second electrical measurement data.

6. The electrical testing meter of claim 1, wherein the wireless transmitter is configured to transmit the electrical measurement data to one or more remote computing entities using a first communication network.

7. The electrical testing meter of claim 1, wherein one or more remote computing entities comprise the at least one client device configured to receive and transmit one or more electrical measurement data via one or more communication networks.

8. The electrical testing meter of claim 1, wherein the controller is configured to render at least a portion of the electrical measurement data for display in an electrical measurement data interface.

9. The electrical testing meter of claim 1, wherein the controller is further configured to generate one or more electrical circuit characteristic data indicating whether at least one element may be safely electrically connected to the electrical circuit based at least in part on the electrical measurement data, and wherein the wireless transmitter is further configured to transmit the one or more electrical circuit characteristic data.

10. The electrical testing meter of claim 1, wherein the controller is configured to generate one or more electrical circuit characteristic data comprising at least location data corresponding to the one or more reference points, and wherein the wireless transmitter is configured to transmit the location data corresponding to the electrical measurement data to one or more remote computing entities.

11. The electrical testing meter of claim 10, wherein the location data is generated by the electrical testing meter.

12. The electrical testing meter of claim 1, wherein the client device is configured to display at least one of: location data, an electrical measurement data identifier, timestamp data, a voltage value, one or more phase voltage difference data, one or more phase angle measurement data, capacitance data, and the safe circuit indicator.

13. A method for testing an electrical circuit, the method comprising:
   generating, via an electrical testing meter, electrical measurement data related to an electrical circuit based at least in part on electrical signals received by the electrical testing meter via at least one electrical measurement terminal in contact with one or more references points of the electrical circuit at a first location;
   generating, via an electrical testing meter, a safe circuit indicator based on at least one of phase voltage difference data and phase angle measurement data that is identified using the electrical measurement data measured at the first location, wherein the safe circuit indicator indicates that a plurality of conductors are in same phase in the electrical circuit; and
   transmitting, via the electrical testing meter, at least a portion of the electrical measurement data and the safe circuit indicator to at least one client device associated with an operator upon determining that the operator is working on the electrical circuit at a second location different from the first location.

14. The method of claim 13, further comprising generating one or more electrical circuit characteristic data based at least in part on the electrical measurement data.

15. The method of claim 13, wherein generating the electrical measurement data comprises generating the electrical measurement data using a phasing voltmeter.

16. The method of claim 15, wherein generating electrical measurement data comprises measuring a first electrical measurement data at a first reference point and a second electrical measurement data at a second reference point.

17. The method of claim 13, further comprising rendering at least a portion of the electrical measurement data for display in an electrical measurement data interface, and wherein the portion of the electrical measurement data comprises location data, an electrical measurement data identifier, timestamp data, a voltage value, one or more phase voltage difference data, one or more phase angle measurement data, and capacitance data.

18. The method of claim 13, wherein transmitting the electrical measurement data to one or more remote computing entities comprises transmitting the electrical measurement data using a first communication network.

19. The method of claim 13, further comprising receiving one or more electrical measurement data via one or more communication networks, wherein one or more remote computing entities comprise at least one or more of a management computing entity and a client device.

20. The method of claim 13, further comprising generating a consolidated record of electrical measurement data for the electrical circuit via at least a first remote computing entity.

* * * * *